United States Patent
Kiyose et al.

(10) Patent No.: US 6,933,790 B2
(45) Date of Patent: Aug. 23, 2005

(54) PHASE LOCKED LOOP CIRCUIT

(75) Inventors: Masashi Kiyose, Gifu (JP); Takuya Shiraishi, Higashiosaka (JP)

(73) Assignee: Sanyo Electric Co., Ltd., Osaka (JP)

(*) Notice: Subject to any disclaimer, the term of this patent is extended or adjusted under 35 U.S.C. 154(b) by 16 days.

(21) Appl. No.: 10/777,481

(22) Filed: Feb. 12, 2004

(65) Prior Publication Data

US 2004/0183576 A1 Sep. 23, 2004

(30) Foreign Application Priority Data

Feb. 12, 2003 (JP) ........................................ 2003-033888
Dec. 15, 2003 (JP) ........................................ 2003-416391

(51) Int. Cl.[7] .............................................. H03L 7/06
(52) U.S. Cl. .......................................... 331/18; 331/25
(58) Field of Search ............................ 331/11, 17, 18, 331/25; 327/141, 156; 375/375, 376

(56) References Cited

U.S. PATENT DOCUMENTS 6,456,573 B1 * 9/2002 Ueki et al. ................ 369/47.17

FOREIGN PATENT DOCUMENTS

JP      2002032962 A  *  1/2002  ........... G11B/20/10

OTHER PUBLICATIONS

Patent Abstracts of Japan, Publication No. 2002-230915, Publication Date Aug. 16, 2002.

* cited by examiner

*Primary Examiner*—Linh My Nguyen
(74) *Attorney, Agent, or Firm*—Fish & Richardson P.C.

(57) ABSTRACT

A PLL circuit for generating a clock signal synchronized with a first reference signal generated by superimposing a wobble signal on a land pre-pit signal or a second reference signal generated from a wobble signal. The PLL circuit enables reduction in circuit scale. When a DVD-R/RW is used as an optical disc, a first loop synchronizes the frequency of a wobble signal with the frequency of a divisional clock signal, which is generated from a recording clock signal of a voltage-controlled oscillator. Further, a second loop synchronizes the phase of the divisional clock signal with the phase of the LPP signal. When a DVD+R/RW is used as an optical disc, the first loop synchronizes the frequency of the divisional clock signal with the frequency of the wobble signal. Further, the second loop applies constant voltage to a control voltage input terminal of the voltage-controlled oscillator.

11 Claims, 8 Drawing Sheets

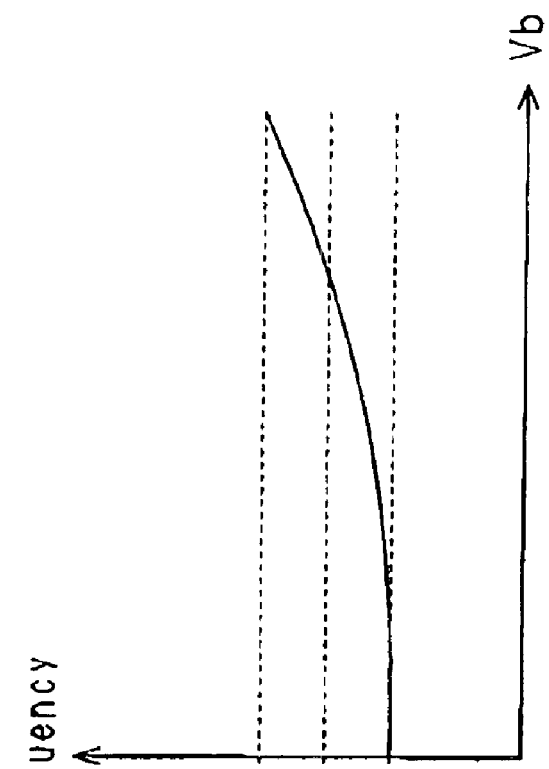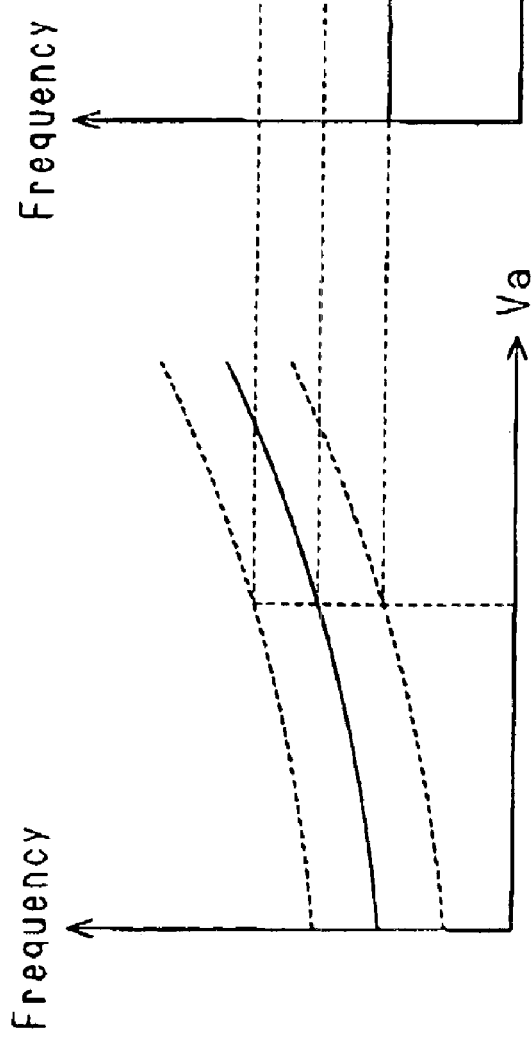

PHASE LOCKED LOOP CIRCUIT

CROSS-REFERENCE TO RELATED APPLICATIONS

This application is based upon and claims the benefit of priority from prior Japanese Patent Applications No. 2003-33888, filed on Feb. 12, 2003, and No. 2003-416391, filed on Dec. 15, 2003, the entire contents of which are incorporated herein by reference.

BACKGROUND OF THE INVENTION

The present invention relates to a phase locked loop (PLL) circuit that receives a first reference signal, which is generated by superimposing a wobble signal on a land pre-pit signal, and a second reference signal, which is generated from a wobble signal, to generate a clock signal synchronized with either one of the first reference signal and the second reference signal.

Recently, various types of disc-type recording media, such as optical discs are becoming more popular. Disc recording media, such as for example, a Digital Versatile Disc-Recordable (DVD-R), a Digital Versatile Disc-Rewritable (DVD-RW), a Digital Versatile Disc + Recordable (DVD+R), and a Digital Versatile Disc + ReWritable (DVD+RW) have been introduced to the market. Although the format of the data recorded on the disc recording medium is the same in these disc recording media, the recording format of the disc positional information in DVD-R and DVD-RW media differs from that in DVD+R and DVD+RW media. The DVD-R and the DVD-RW (hereinafter referred to as DVD-R/RW) and the DVD+R and the DVD+RW (hereinafter referred to as DVD+R/RW) are standardized disc recording media for recording data in compliance with the same data format, as shown in FIG. 13.

FIG. 13 shows the configuration of one sector of the recording data in a DVD. The DVD data to be recorded on the DVD disc medium consists of 32 bits of synchronizing signal (SYNC in FIG. 13) and 1456 bits of modulated data. In other words, 728 bits of data are 8-16 modulated to produce 1456 bits of data, and 32 bits of a synchronizing signal (SYNC) are added to the head of each of the 1456 bits of modulated data. This generates one frame of recording data. In a DVD, 26 frames of recording data make up one sector.

The recording format of disc positional information recorded on the DVD disc medium differs depending on the type of the DVD disc medium.

The DVD-R/RW is provided with a track formed by a groove, which is formed in a flat surface (land) of the disc. The groove is formed so as to meander at a rate of sixteen cycles for every two frames in a data recording region in the format data (FIG. 14(a)). A wobble signal having a predetermined cycle is extracted from such meandering (wobble) of the groove.

Further, the DVD-R/RW has, in addition to the wobble, a Land Pre-Pit (LPP), which represents disc positional information on the track and which is provided at predetermined intervals. The LPP is provided for every two frames in the data recording region in the above format data. A group of the LPPs that are provided for each of sixteen sectors of the recording region in the above format data represents positional information of the disc.

The DVD+R/RW is also provided with a track formed by a groove, which is formed in a flat surface (land) of the disc. A wobble signal having a predetermined cycle is extracted from the meandering (wobble) of the groove. The meandering cycle of the DVD+R/RW groove is longer than the meandering cycle of the OVD-R/RW groove. The DVD+R/RW groove meanders at a rate of 93 cycles for every two frames in a data recording region in the above format data.

There are no LPPs formed on the DVD+R/RW. In place of the LPP, the groove is formed so that phase-modulation is performed on the wobble signal of the predetermined cycle in accordance with disc positional information, which is referred to as Address In Pregroove (ADIP). More specifically, the wobble is phase-modulated once for every two frames in the data recording region in the above format data. The ADIPs acquired from each of four sectors of the recording region in the above format data represent the disc positional information.

The recording of data to a disc medium is performed by irradiating a laser beam on the disc medium, the rotation of which is controlled. It is preferred that the recording of data be performed in accordance with a reference clock signal, which corresponds to the rotation of the disc medium. The reference clock signal enables the recording region for every one bit of data that is recorded to the disc medium to be constant and thus enables the recording of data to be accurately controlled.

A PLL circuit uses a reproduced wobble signal or LPP signal to generate a pulse signal, which is synchronized with the wobble signal and the LPP signal, to acquire the reference clock signal. Japanese Laid-Open Patent Publication No. 2002-230915 describes a conventional PLL circuit. The PLL circuit compares the phase of a clock signal, the oscillation of which is controlled by a voltage-controlled oscillator, and the phase of a wobble signal or LPP signal to calculate a frequency difference between the two signals. Then, the PLL circuit feeds back voltage, which is in accordance with the frequency difference, to the voltage-controlled oscillator. This synchronizes the clock signal with the wobble signal or the LPP signal.

The recording format of the disc position information differs between the DVD-R/RW media and the DVD+R/RW media. Thus, a data recording controller that may be used in a compatible manner for both DVD-R/RW and DVD+R/RW includes a DVD-R/RW clock signal generation circuit and a DVD+R/RW clock signal generation circuit. The circuit scale (size and number of devices) of a clock signal generation circuit is relatively large. This enlarges the circuit scale of a data recording controller provided with both DVD-R/RW and DVD+R/RW clock signal generation circuits.

SUMMARY OF THE INVENTION

One aspect of the present invention is a PLL circuit for receiving either one of first and second reference signals to generate a clock signal synchronized with one of the first and second reference signals. The first reference signal is generated by superimposing a first wobble signal having a first cycle on a land pre-pit signal, and the second reference signal is generated from a second wobble signal having a second cycle shorter than the first cycle. The PLL circuit includes a voltage-controlled oscillator for generating the clock signal in accordance with control voltages. A first loop, connected to the voltage-controlled oscillator, controls at least one of a frequency and a phase of the clock signal in accordance with one of the first wobble signal and the second wobble signal. A second loop, connected to the voltage-controlled oscillator, controls at least one of the frequency and the phase of the clock signal in accordance with the land pre-pit signal. The first and second loops are validated when the PLL circuit is provided with the first reference signal, and the first loop is validated and the second loop is invalidated when the PLL circuit is provided with the second reference signal.

A further aspect of the present invention is a PLL circuit for generating a clock signal from a first wobble signal having a first cycle and a land pre-pit signal or from a second wobble signal having a second cycle shorter than the first cycle. The PLL circuit has a voltage-controlled oscillator including a first input terminal and a second input terminal respectively receiving a first control voltage and a second control voltage for generating the clock signal with a frequency and a phase that are in accordance with the first and second control voltages. A first loop, connected to the voltage-controlled oscillator, includes a first divider for dividing the clock signal to generate a first divisional clock signal and a frequency comparator, connected to the first divider, for comparing the frequency of one of the first wobble signal and the second wobble signal with the frequency of the first divisional clock signal. The first loop generates the first control voltage in accordance with the frequency difference between the two compared signals. A second loop, connected to the voltage-controlled oscillator, includes a second divider for dividing the clock signal to generate a second divisional clock signal and a phase comparator, connected to the second divider, for comparing the phase of the land pre-pit signal and the phase of the second divisional clock signal. The second loop generates the second control voltage in accordance with the phase difference between the two compared signals. The voltage-controlled oscillator is shared by the first and second loops. A voltage generation circuit generates a constant voltage. The first and second input terminals are respectively supplied with the first and second control voltages when the PLL circuit is provided with the first wobble signal and the land pre-pit signal, and the first and second input terminals are respectively supplied with the first control voltage and the constant voltage and the second control voltage is invalidated when the PLL circuit is provided with the second wobble signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which:

FIGS. 3, 4, 5, 6A and 6B are graphs showing the characteristics of the voltage-controlled oscillator of FIG. 2;

DETAILED DESCRIPTION OF THE PREFERRED EMBODIMENT

A PLL circuit incorporated in a data recording controller, adapted to both DVD-R/RW and DVD+R/RW media, according to a preferred embodiment of the present invention will now be discussed.

Figure 1:
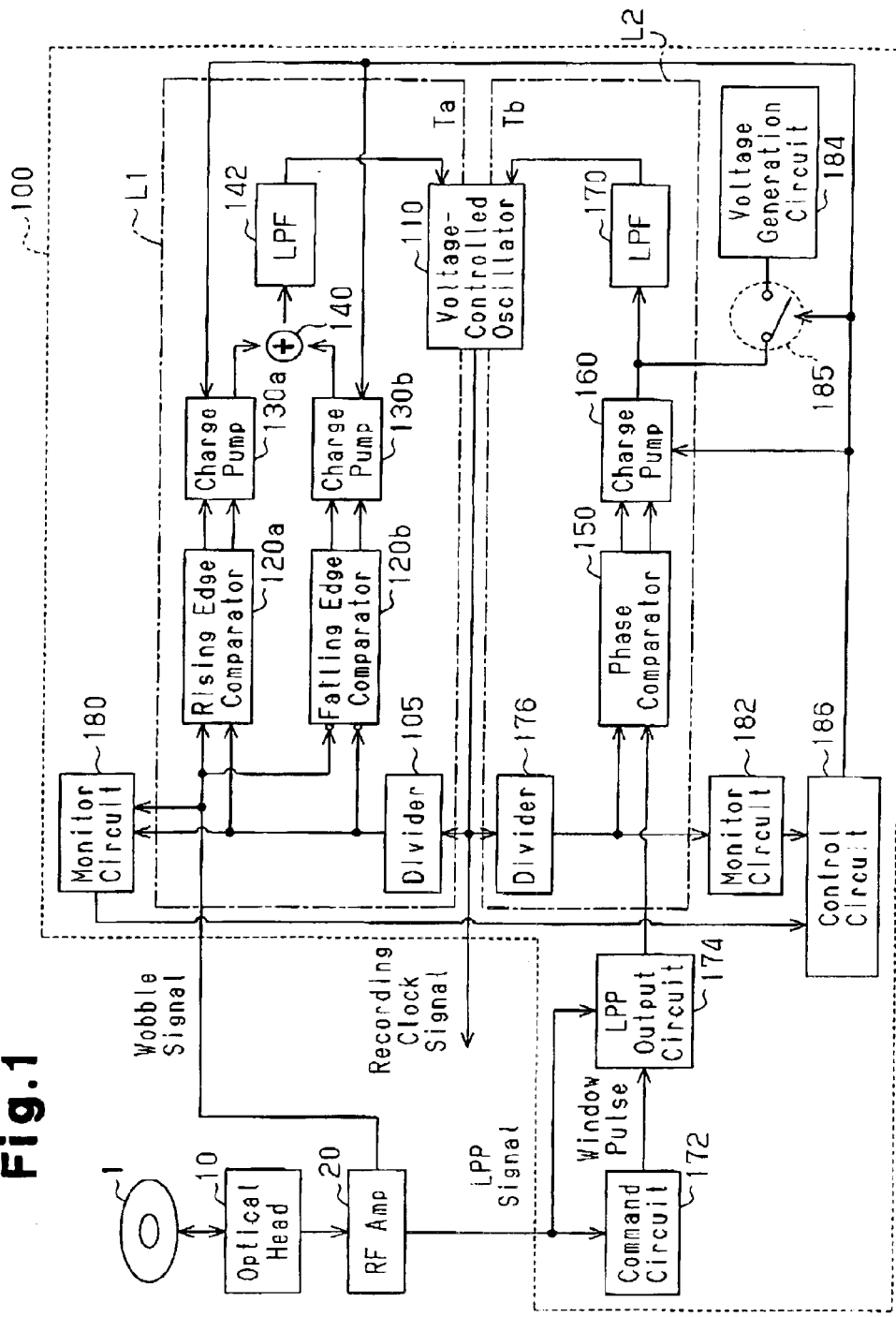
FIG. 1 is a block diagram of a PLL circuit according to a preferred embodiment of the present invention.

FIG. 1 is a block diagram of the data recording controller.

An optical disc 1 is a disc medium to which data may be written (recorded). In the data recording controller of the preferred embodiment, data may be recorded to both DVD-R/RW and DVD+R/RW media.

The data recording controller includes an optical head 10, an RF amp 20, and a clock signal generator 100. The optical head 10 irradiates the optical disc 1 with a laser beam and receives the reflection of the laser beam. The RF amp 20 generates a binary digital signal from the reflection to generate a wobble signal or an LPP signal.

Based on the wobble signal or the LPP signal, the clock signal generator 100 functions as a PLL circuit that generates an appropriate clock signal for recording data in accordance with the type of the optical disc 1 (DVD-R/RW or DVD+R/RW).

The circuits related to the recording of data when the optical disc 1 is a DVD-R/RW will now be discussed.

The DVD-R/RW includes a spiral pregroove and land prepits (LPPs), which are arranged between adjacent pregrooves. The pregroove wobbles and functions as a guide groove for the optical disc 1. A signal having a frequency of 140.6 kHz is extracted from the wobble of the pregroove. A signal having a frequency of 140.6 kHz is extracted from the wobble of the pregroove. The LPPs are formed at predetermined intervals along the pregrooves. The LPP interval is set to extract a signal having one pulse for about every sixteen pulses of the wobble signal. The LPPs are reproduced to extract an LPP signal.

The clock signal generator 100 divides the frequency of the LPP signal by a dividing ratio of 1/2976. In other words, the clock signal generator 100 generates a clock signal having 2976 pulses for each pulse interval of the LPP signal. The frequency of the generated clock signal is 26.16 MHz.

The clock signal generator 100 synchronizes the frequency of the recording clock signal with that of the wobble signal and adjusts the phase of the recording clock signal based on the LPP signal.

The recording clock signal, which is phase-synchronized to the LPP signal, is generated through two processes in which the recording clock signal is first roughly adjusted based on the wobble signal and then finely adjusted based on the LPP signal. More specifically, after decreasing the frequency difference between the wobble signal and the recording clock signal so that the difference is within a predetermined range, the recording clock signal undergoes phase adjustment based on the LPP signal. This is because it is difficult to generate the recording clock signal directly from the LPP signal since the frequency of the LPP signal is lower than that of the wobble signal and since there may be missing LPPs in the disc medium when recording data.

The clock signal generator 100 includes a first loop L1 and a second loop L2, which share a voltage-controlled oscillator 110. The first loop L1 includes a divider 105, which generates a divisional clock signal by dividing the clock signal output from the voltage-controlled oscillator 110. The first loop L2 synchronizes the frequency of the divisional clock signal of the divider 105 with the frequency of the wobble signal. The second loop L2 includes a divider 176, which generates a divisional clock signal by dividing the clock signal output from the voltage-controlled oscillator 110. The second loop L2 synchronizes the phase of the divisional clock signal with the phase of the LPP signal. The voltage-controlled oscillator 110 includes two control voltage input terminals Ta and Tb. Voltage corresponding to the frequency difference between the divisional clock signal and the wobble signal and voltage corresponding to the phase difference between the divisional clock signal and the LPP signal are respectively applied to the control voltage input terminals Ta and Tb.

The voltage-controlled oscillator 110 will now be described.

Figure 2:
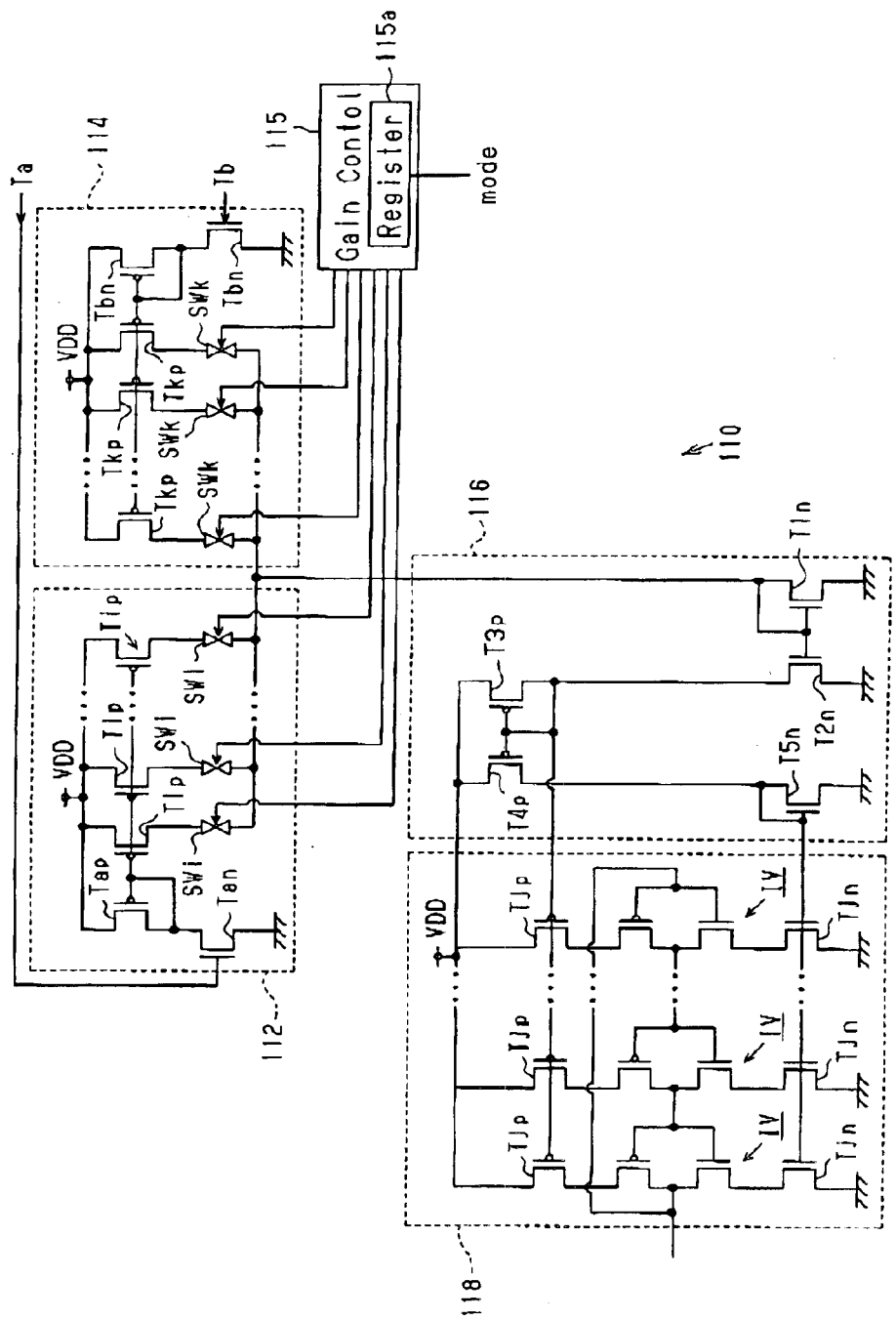
FIG. 2 is a circuit diagram of a voltage-controlled oscillator shown in FIG. 1.

Referring to FIG. 2, the voltage-controlled oscillator 110 includes a first current source 112, a second current source 114, a gain control circuit 115, a control voltage generation circuit 116, and a ring oscillator 118.

The first current source 112 performs gain control on the control current corresponding to the control voltage applied to the control voltage input terminal Ta to drive the ring oscillator 118. The first current source 112 has an output current route having a plurality of stages including a plurality of p-channel transistors Tip and a plurality of switches SWi, which are respectively connected in series to the transistors Tip. The p-channel transistors Tip and the switches SWi are connected in parallel to the power supply of the power supply voltage VDD and the output terminal of the first current source 112. The gain control circuit 115 connects and disconnects the power supply and the output terminal in accordance with a control signal, which activates and inactivates each switch SWi, to change the number of stages used in the output current route.

The first current source 112 has an input current route including an n-channel transistor Tan and a p-channel transistor Tap, which are connected in series between the power supply of the power supply voltage VDD and ground. Control voltage is applied to the gate of the n-channel transistor Tan via a control voltage input terminal Ta. The amount of current flowing through the p-channel transistor Tap and the voltage of the gate is determined in accordance with the level of the control voltage. The same voltage as the gate voltage of the p-channel transistor Tap is applied to the gate of the p-channel transistor Tip, which is a current mirror connected to the p-channel transistor Tap. Further, the same voltage is applied to the gate of the p-channel transistor Tip, which is connected in parallel to the p-channel transistor Tip, to determine the amount of current flowing through the source and drain. Accordingly, the amount of current output from the first current source 112 is controlled in accordance with the level of the control voltage applied to the control voltage input terminal Ta.

The second current source 114 has the same configuration as the first current source 112. However, the second current source 114 performs gain adjustment on the control voltage input from the control voltage input terminal Tb to drive the ring oscillator 118. The amount of current output from the second current source 114 is controlled in accordance with the level of the control voltage applied to the control voltage input terminal Tb.

The gain control circuit 115 controls the switching between the first current source 112 and the second current source 114 in accordance with mode data stored in a register 115a. That is, the gain control circuit 115 selectively opens and closes switches SWi in the first current source 112 and switches SWk in the second current source 114 to adjust the varying ratio of the output current of the first and second current sources 112 and 114 with respect to changes in the voltage applied to the control voltage input terminals Ta and Tb.

The control voltage generation circuit 116 converts a current signal, which is output from the first current source 112 and the second current source 114, to a voltage signal. The control voltage generation circuit 116 has a current mirror circuit, which includes two stages of n-channel transistors T1n and T2n and p-channel transistors T3p and T4p. The gate bias voltage of an n-channel transistor T5n, which is connected in series to the p-channel transistor T4p and the second current mirror circuit, is provided to the ring oscillator 118.

The ring oscillator 118 includes an odd number of inverters Iv connected to the power supply of the power supply voltage VDD and the ground. The amount of current provided to each inverter IV is controlled in accordance with the control voltage applied to the control voltage input terminal Ta and the control voltage input terminal Tb. More specifically, a p-channel transistor Tjp is connected between the power supply of the power supply voltage VDD and each inverter IV. A n-channel transistor Tjn is connected between each inverter IV and the ground. Voltage corresponding to the output current of the first current source 112 and the second current source 114 is applied to the transistors Tjp and Tjn via the control voltage generation circuit 116. The transistors Tjp and Tjn control the amount of current that flows to the inverters IV.

The characteristics of the voltage-controlled oscillator 110 will now be described.

Figure 3:
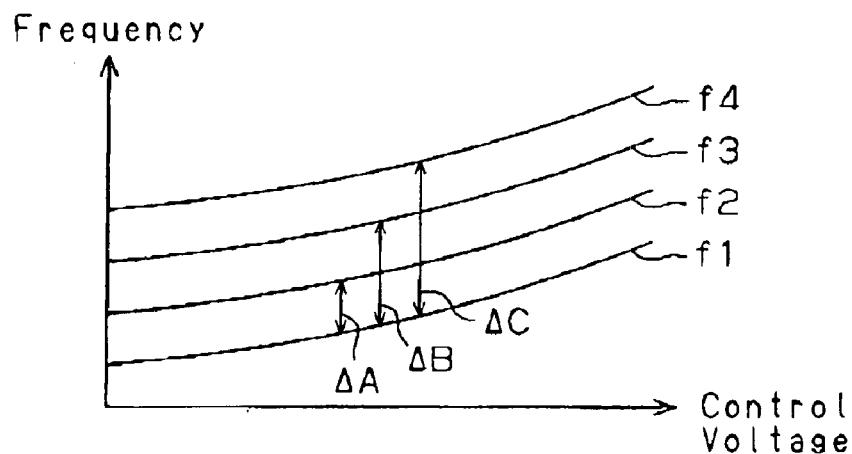

FIG. 3 is a graph showing the relationship between the control voltage applied to the control voltage input terminal Ta and the oscillation frequency of the voltage-controlled oscillator 110. Curve f1 is obtained when the voltage applied to the control voltage input terminal Tb is null. Curves f2, f3, and f4 are obtained when the number of output current route stages used in the second current source 114 of FIG. 2 is one, two, and three, respectively. The oscillation frequency increases as the control voltage applied to the control voltage input terminal Ta increases. When the control voltage applied to the control voltage input terminal Ta is constant, the oscillation frequency increases as the number of stages (number of activated stages) used in the output current route of the second current source 114 increases.

Under the condition that the control voltage applied to the control voltage input terminal Ta is constant, the bandwidth of the oscillation frequency when the voltage applied to the control voltage input terminal Tb is variable, increases as the number of stages used in the output current route of the second current source 114 increases ($\Delta A < \Delta B < \Delta C$). Accordingly, when the number of stages used in the output current route of the second current source 114 is fixed to a predetermined number n and the voltage applied to the control voltage input terminal Ta and the control voltage input terminal Tb are variable, the oscillation frequency of the voltage-controlled oscillator 110 is varied within the band indicated by the inclined lines in FIG. 4.

Figure 5:
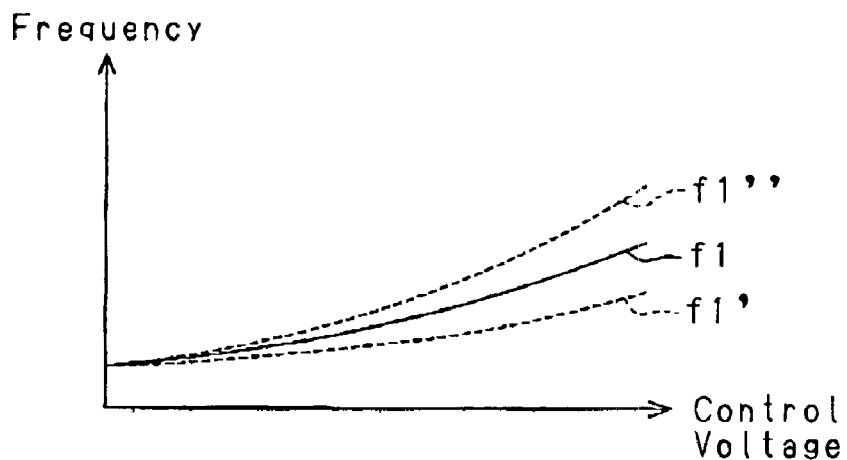

When the voltage applied to the control voltage input terminal Tb is fixed to a null value and the number of stages used in the output current route of the first current source 112 shown in FIG. 2 is changed, the oscillation frequency varies in accordance with the voltage applied to the control voltage input terminal Ta as shown in FIG. 5. The number of stages used in the output current route of the first current source 112 increases from curve f1' to curve f1 to curve f1". As the number of stages used in the output current route increases, the rate of increase of the oscillation frequency with respect to the change in the voltage applied to the control voltage input terminal Ta increases.

Figure 4:
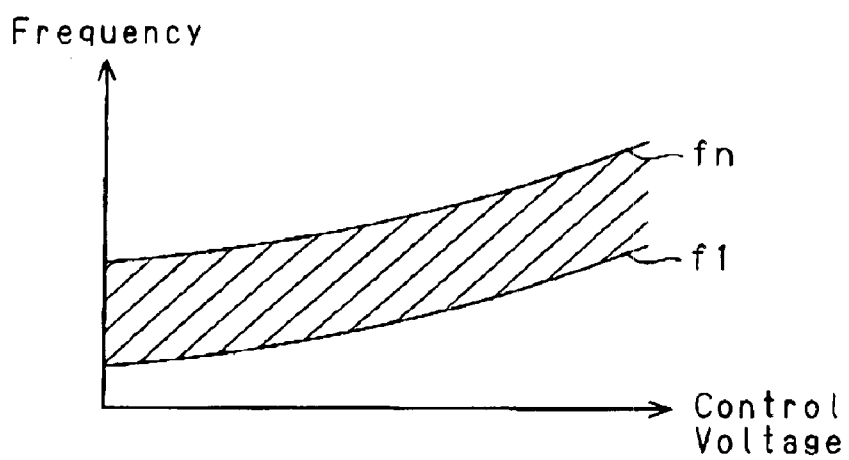

When the roles of the control voltage input terminal Ta and the control voltage input terminal Tb are reversed, the same characteristics as those schematically shown in FIGS. 3 to 5 are obtained.

In the voltage-controlled oscillator 110, which includes the two control voltage input terminals Ta and Tb, the output voltage Va of a low-pass filter 142, which is shown in FIG. 1, is applied to the control voltage input terminal Ta, and the output voltage Vb of a low-pass filter 170, which is shown in FIG. 1, is applied to the control voltage input terminal Tb. This synchronizes the frequency of the clock signal oscillated by the voltage-controlled oscillator 110 (more accurately, the divisional clock signal) with the frequency of the wobble signal through the control voltage input terminal Tb and synchronizes the phase of the clock signal (more accurately, the divisional clock signal) with the phase of the LPP signal through the control voltage input terminal Tb. That is, the control voltage of the control voltage input terminal Ta is used to roughly adjust the oscillation frequency as shown in FIG. 6(b), and the control voltage of the control voltage input terminal Tb is used to finely adjust the oscillation frequency as shown in FIG. 6(b).

Circuits for performing fine adjustment and rough adjustment of the oscillation frequency of the voltage-controlled oscillator 110 will now be discussed.

The first loop L1 will first be described.

The first loop L1 compares the rising edges of the recording clock signal, which is oscillated by the voltage-controlled oscillator 110, and the wobble signal. The first loop L1 also compares the falling edges of the recording clock signal and the wobble signal. Based on the comparison results, the first loop L1 controls the voltage-controlled oscillator 110. The comparisons of the rising edges and the falling edges are performed for the reasons described below.

Figure 7:
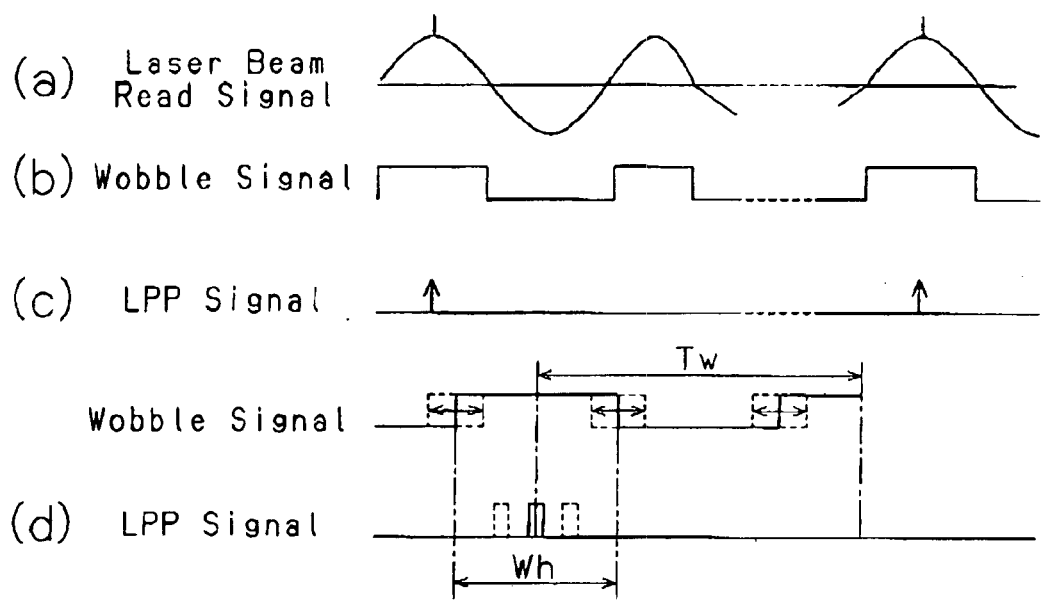
FIG. 7 is a timing chart illustrating the waveforms of a wobble signal and an LPP signal.

Referring to FIG. 7(a), the RF amp 20 binary codes and converts the signal corresponding to the wobble of the disc medium read with a laser beam to a wobble signal (FIG. 7(b)). The wobble signal is a signal for which duty ratio changes. Thus, when the voltage-controlled oscillator 110 is controlled based on the phase difference between the divisional clock signal and the wobble signal, the control is affected by the changes in the duty ratio of the wobble signal.

However, referring to FIG. 7(d), the pulse width Wh of the wobble signal changes, but the cycle Tw between the centers of the pulses does not change. Accordingly, the voltage-controlled oscillator 110 is controlled using the cycle Tw and phase of the pulse centers in the wobble signal and the cycle and phase of the pulse centers in the divisional clock signal to avoid the influence of changes in the duty ratio.

Figure 8:
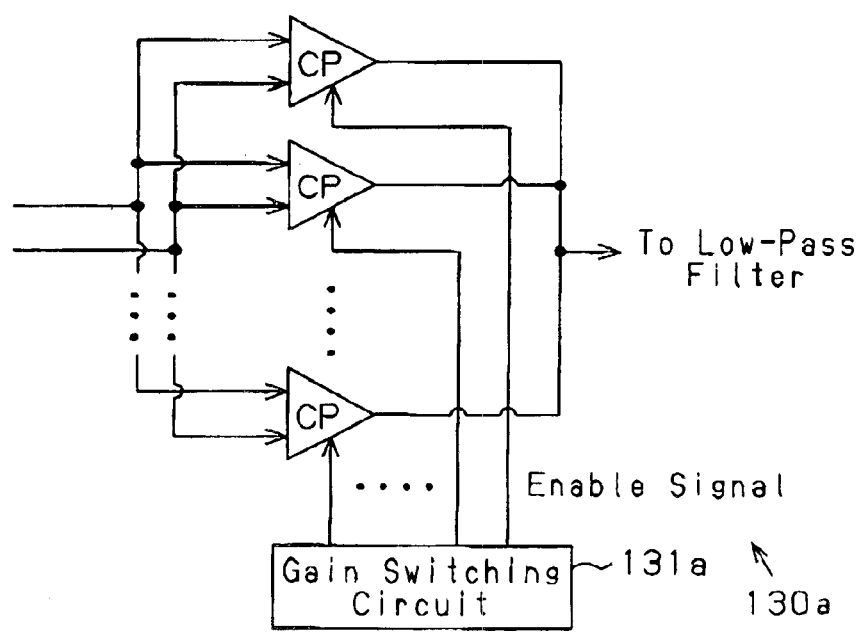
FIG. 8 is a circuit diagram of a charge pump shown in FIG. 8.

More specifically, in the first loop L1 of FIG. 1, a rising edge comparator 120a and a falling edge comparator 120b respectively compares the rising edges and falling edges of the wobble signal and the divisional clock signal. Signals generated from the comparison results are respectively converted to predetermined outputs by a charge pump 130a and a charge pump 130b. The signals of which outputs have been converted are synthesized by an adder 140 and smoothed by a low-pass filter 142 and applied to the control voltage input terminal Ta of the voltage-controlled oscillator 110 as a control voltage. The frequency of the clock signal, which is oscillated by the voltage-controlled oscillator 110 and controlled by the control voltage, is divided by the divider 105 and input to the rising edge comparator 120a and the falling edge comparator 120b. The clock signal (or its divisional clock signal), which is oscillated from the voltage-controlled oscillator 110, is controlled to be frequency-synchronized with the wobble signal. The dividing ratio of the divider 105 is 1/186 and, in this case, the frequency of the output signal of the voltage-controlled oscillator 110 is 26.16 MHz The charge pump 130a, of which gain is variable, is shown in FIG. 8. The charge pump 130a includes a plurality of charge pump units CP, which output current in accordance with the output signal of the rising edge comparator 120a, and a gain switching circuit 131a, which drives selected ones of the charge pump units CP. The gain switching circuit 131a changes the number of stages of the charge pump units CP that are driven to switch the gain of the charge pump 130a, that is, the output current amount level of the charge pump 130a with respect to the phase comparison output.

Figure 9:
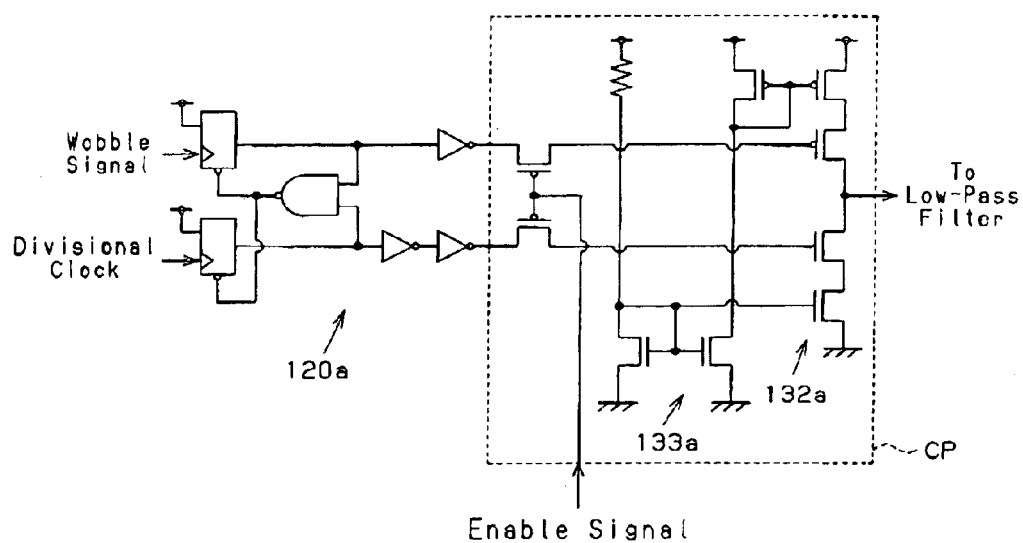
FIG. 9 is a circuit diagram of a rising edge comparator and a charge pump unit shown in FIG. 1.

Referring to FIG. 9, each charge pump unit CP includes an output circuit 132a, which outputs a signal corresponding to the signal received from the rising edge comparator 120a, and a bias circuit 133a, which adjusts the output of the output circuit 132a. When a pulse of the wobble signal rises before the pulse of the divisional clock signal rises, the output circuit 132a outputs a signal having a high potential (performs charging) from when the wobble signal rises to when the divisional clock signal rises. Further, when a pulse of the divisional clock signal rises before the pulse of the wobble signal rises, the output circuit 132a outputs a signal having a low potential (performs discharging) from when the divisional clock signal rises to when the wobble signal rises.

In the charge pump 130a, when the charging period is equal to the discharging period, the charge current and the discharge current are set to be equal to each other.

The rising edge comparator 120a controls the charge pump 130a to generate the predetermined output signal from when the pulse of either one of the input wobble signal and the divisional clock signal rises to when the pulse of the other one of the signals rises. The wobble signal and the divisional clock signal are respectively input to different flip-flops (F/F). In synchronism with the rising edge of the input pulse, the flip-flops output a signal having a high level. When the pulses of two flip-flops both rise, the two flip-flops are reset to interrupt the output of the signal from the charge pump 130a.

The falling edge comparator 120b and the charge pump 130b of FIG. 1 have the same configuration as the rising edge comparator 120a and the charge pump 130a. As shown in FIG. 1, the falling edge comparator 120b detects a falling edge when the signal input to the rising edge comparator 120a is inverted by an inverter.

Figure 10:
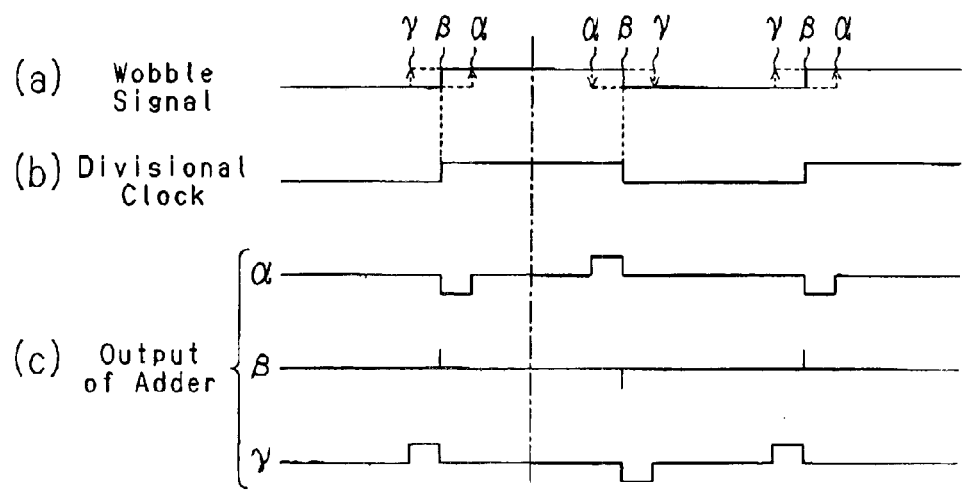
FIG. 10 is a timing chart illustrating a process for generating a clock signal synchronized with the wobble signal.

FIG. 10 shows the relationship between the signals input to the rising edge comparator 120a and the falling edge comparator 120b and the output of the adder 140. When the divisional clock signal (FIG. 10(b)) and the wobble signal (FIG. 10(a)) rise and fall at the same timing (β), the output of the adder 140 is substantially null.

In comparison, when the divisional clock signal has a pulse width that is narrower than that of the wobble signal (α in FIG. 10(a)), the adder 140 outputs a signal having a low potential (performs discharging) from when the pulse of the divisional clock signal goes high to when the pulse of the wobble signal goes high, and the adder 140 outputs a signal having a high potential (performs charging) from when the pulse of the divisional clock signal goes low to when the pulse of the wobble signal goes low (refer to α in FIG. 10(c)). The period from when the pulse of the divisional clock signal goes high to when the pulse of the wobble signal goes high is equal to the period from when the pulse of the wobble signal goes low to when the pulse of the divisional clock signal goes low. This equalizes the discharge current and the charge current.

When the pulse width of the divisional clock signal becomes greater than the pulse width of the wobble signal (γ in FIG. 10(a)), the adder 140 outputs a signal having a high potential (performs charging) from when the pulse of the wobble signal goes high to when the pulse of the divisional clock signal goes high, and the adder 140 outputs a signal having a low potential (performs discharging) from when the pulse of the divisional clock signal goes low to when the pulse of the wobble signal goes low (refer to γ in FIG. 10(c)). The period from when the pulse of the wobble signal goes high to when the pulse of the divisional clock signal goes high is equal to the period from when the pulse of the divisional clock signal goes low to when the pulse of the wobble signal goes low. This equalizes the charge current and the discharge current.

In this manner, when the pulse centers are the same, the charge current and the discharge current are equalized with each other in the charge pumps 130a and 130b. Accordingly, the centers of the wobble signal and the divisional clock signal coincide with each other regardless of the difference between the pulse widths of the wobble signal and the divisional clock signal.

The second loop L2 of FIG. 1 will now be described. The second loop L2 synchronizes the phase of the divisional clock signal of the clock signal oscillated by the voltage-controlled oscillator 110 with the phase of the LPP signal.

In the second loop L2, the period during which the LPP should be detected is predicted in order to distinguish the LPP signal input to the clock signal generator 100 from noise. That is, a command circuit 172 stores the time at which the LPP signal is detected for the first time and, for example, counts the clock signal output from the clock signal generator 100 to predict the period from when the LPP signal is detected to when the next LPP is detected. The command circuit 172 outputs a window pulse at a predetermined cycle in synchronism with the time in which the LPP signal should be detected. The window pulse has a pulse width that covers the period during which there is a possibility that the LPP signal may be detected. In an LPP output circuit 174, the LPP signal is output only when the LPP signal is detected during the period in which the window pulse is input. This avoids erroneous detection of noise as the LPP signal.

A phase comparator 150 compares the phase of the LPP signal output from the LPP output circuit 174 and the phase of the divisional clock signal, which is the clock signal oscillated by the voltage-controlled oscillator 110 divided by the divider 176. A charge pump 160 converts a signal generated from the comparison result to a signal having a predetermined output level. A low-pass filter 170 then smoothes the converted signal. The control voltage signal output from the low-pass filter 170 is applied to the control voltage input terminal Tb of the voltage-controlled oscillator 110.

The dividing ratio of the divider 176 is determined to generate the clock signal so that it deviates from the phase of the LPP signal by a predetermined phase. The phase comparator 150 outputs the signal generated from the comparison between the LPP signal and the divisional clock signal only when the LPP signal is output from the LPP output circuit 174. Thus, the phase comparator 150 compares the divisional clock signal, which is generated by dividing the clock signal oscillated from the voltage-controlled oscillator 110 by a dividing ratio of 1/2976, and the LPP signal to adjust the frequency of the clock signal oscillated from the voltage-controlled oscillator 110 by 26.12 MHz.

Figure 11:
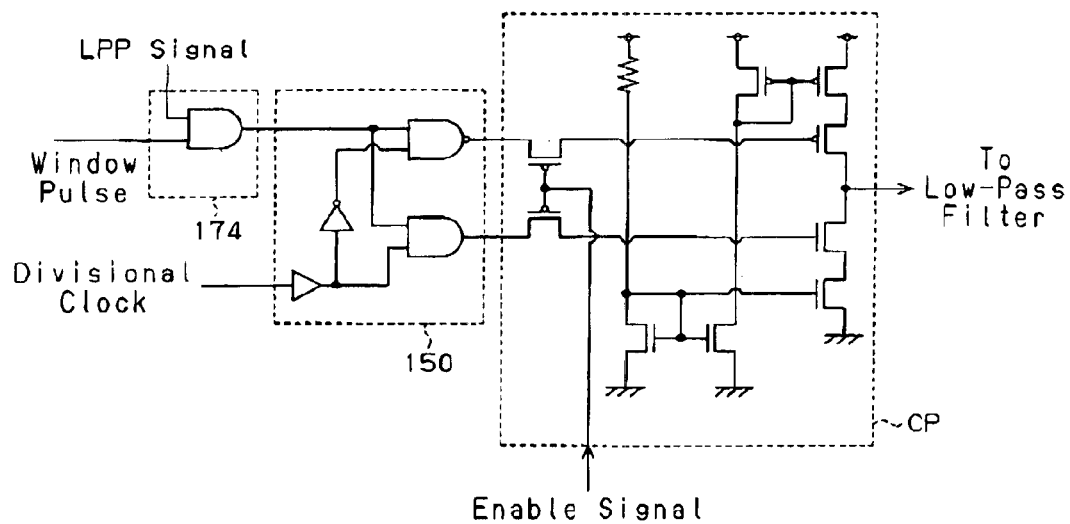
FIG. 11 is a circuit diagram of a phase comparator and charge pump unit shown in FIG. 1.

The comparison of the LPP signal and the divisional clock signal is controlled so that the rising edge of the pulses input to the phase comparator 150 from the voltage-controlled oscillator 110 via the divider 176 coincides with the pulse centers of the LPP signal input to the phase comparator 150. FIG. 11 shows an example of the configuration of the LPP output circuit 174 and the phase comparator 150 that perform such control. As shown in FIG. 11, the charge pump unit CP, which is connected to the output side of the phase comparator 150, is incorporated in the charge pump 160. The charge pump 160 has the same configuration as the charge pump 130a of FIG. 8.

Figure 12:
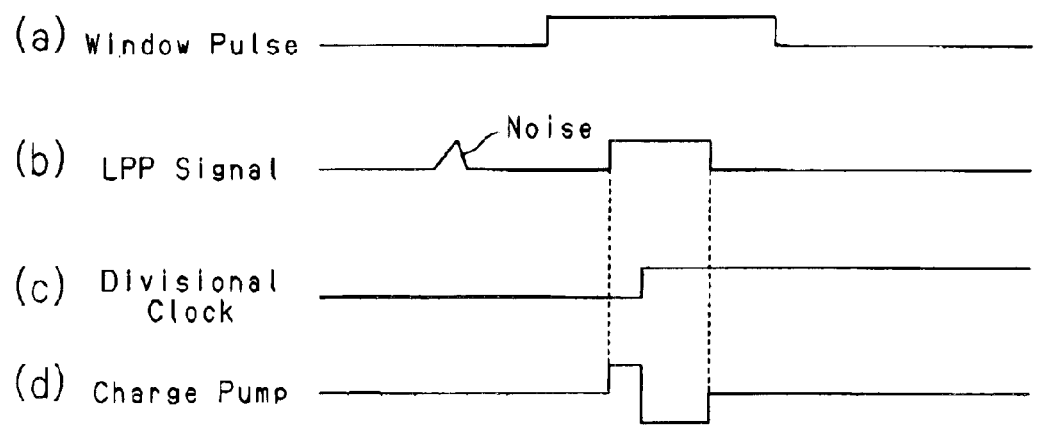
FIG. 12 is a timing chart illustrating a process for generating a clock signal synchronized with the LPP signal.
Figure 13:
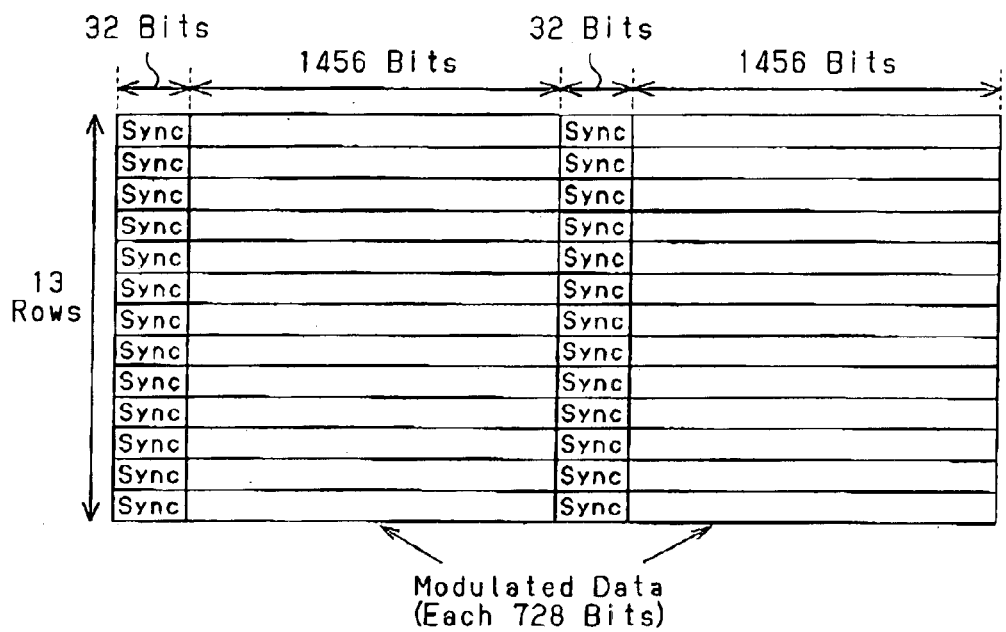
FIG. 13 is a diagram showing the format of the data modulated in a DVD.
Figure 14:
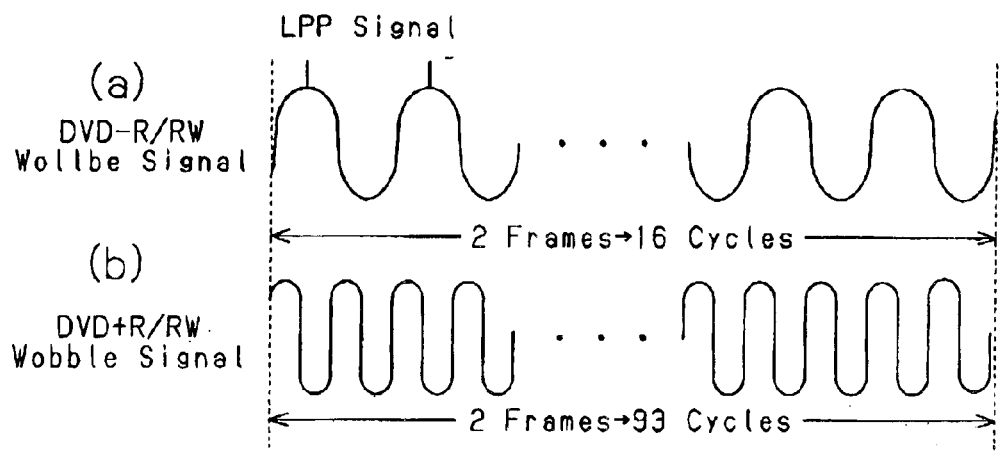
FIG. 14 is a diagram showing the waveforms of a DVD-R wobble signal and a DVD+R wobble signal.

FIG. 12 shows the relationship between the window pulse and LPP signal, which are shown in FIG. 1, the divisional clock signal, which is output from the divider 176, and the output of the charge pump 160.

Even if noise is mixed (FIG. 12(b)) in with the LPP signal during the period in which the window pulse is not input to the LPP output circuit 174, such a signal is not output to the phase comparator 150. Conversely, if the LPP signal is input (FIG. 12(b)) when the window pulse (FIG. 12(a)) is input to the LPP output circuit 174, the LPP signal is output to the phase comparator 150. This outputs a signal having a high potential during the period from when the LPP signal is input to the phase comparator 150 to when the pulse of the divisional clock signal (FIG. 12(c)) goes high. During the period in which the pulse of the LPP signal is input and the pulse of the divisional clock signal goes high (FIG. 12(c)), the charge pump 160 outputs a signal at a high potential.

The charge pump 160 is set so that the charge current and the discharge current are equalized when the charging time is equal to the discharging time. As a result, the charging time and the discharging time are equalized when the rising edge of the divisional clock signal coincides with the center of the LPP signal. This equalizes the charge current and the discharge current. In this manner, the voltage-controlled oscillator 110 is controlled based on the output signal of the charge pump 160 so that the rising edge of the pulse of the divisional clock signal output from the divider 176 coincides with the pulse of the LPP signal.

The fine adjustment with the second loop L2 synchronizes the frequencies of the clock signal, which is oscillated by the voltage-controlled oscillator 110, and the wobble signal while synchronizing the phases of the clock signal and the LPP signal. Thus, even if the LPP signal of FIG. 7(c) and the center of the wobble signal fluctuates as shown in FIG. 7(d), the clock signal oscillated from the voltage-controlled oscillator 110 is controlled to be phase-synchronized with the LPP signal.

The two-step process using the first loop L1 and the second loop L2, that is, the rough adjustment for synchronizing the frequencies of the clock signal and the wobble signal, and the fine adjustment for synchronizing the phases of the clock signal and the LPP signal will now be discussed. A first monitor circuit 180, a second monitor circuit 182, and a control circuit 186 perform the rough adjustment and fine adjustment.

The first monitor circuit 180 receives the wobble signal and the divisional clock signal of the divider 105 to monitor whether the first loop L1 has completed frequency synchronization of the wobble signal and the divisional clock signal.

The second monitor circuit 182 receives the LPP signal and the divisional clock signal of the divider 176 to monitor the conditions of the LPP signal and the divisional clock signal processed by the second loop L2.

The control circuit 186 controls the first monitor circuit 180 and the second monitor circuit 182 to perform the rough adjustment and the fine adjustment in accordance with the signals from the first monitor circuit 180 and the second monitor circuit 182.

In a data recording controller having such a configuration, circuits for performing data recording when the optical disc 1 is a DVD+R/RW will now be described.

A DVD+R/RW includes a pregroove, which functions as a guide groove for the disc. The pregroove wobbles along the optical disc 1. A signal having a wobble component has a frequency of 817.5 kHz. The clock signal generator 100 generates a clock signal by dividing the frequency of the wobble signal by a dividing ratio of 1/32.

When the optical disc 1 is a DVD+R/RW, the first loop L1 synchronizes the clock signal output from the voltage-controlled oscillator 110 with the wobble signal of the DVD+R/RW. More specifically, the dividing ratio of the divider 105 is set to 1/32 to control the frequency of the clock signal, which is oscillated by the voltage-controlled oscillator 110 based on the 817.5 kHz wobble signal, to control the frequency of the clock signal oscillated by the voltage-controlled oscillator 110 at 26.16 MHz. In such a state, the second loop L2 is controlled as an open loop, and a constant voltage is applied to the control voltage input terminal Tb of the voltage-controlled oscillator 110.

To perform such controlling, the preferred embodiment includes a voltage generation circuit 184, which outputs a constant voltage to the low-pass filter 170 of the second loop L2, and a switching circuit 185, which connects and disconnects the voltage generation circuit 184 and the low-pass filter 170. The voltage generation circuit 184 generates a predetermined DC voltage. Further, the switching circuit 185 is controlled by a control circuit 186.

The control for generating the clock signal with the clock signal generator 100 when the optical disc 1 is a DVD-R/RW and when the optical disc 1 is a DVD+R/RW will now be described.

An external circuit outside the clock signal generator 100, such as a microcomputer for centrally controlling each circuit of the data recording controller, inputs to the control circuit 186 a mode signal indicating the type of the optical disc 1 (DVD-R/RW or DVD+R/RW). Further, the external circuit writes mode data to the register 115a in the gain control circuit 115 of the voltage-controlled oscillator 110 shown in FIG. 2. Based on the mode data, the voltage-controlled oscillator 110 sets the number of stages used in the output current route of the first current source 112 and the second current source 114 so that the gain (drive capacity) is in accordance with the type of the optical disc 1.

In the control circuit 186 of FIG. 1, the charge pumps 130a and 130b set the drive capacity that is set in accordance with the optical disc 1. The setting of the drive capacity of the charge pumps 130a and 130b with the control circuit 186 is performed by outputting a command signal to the gain switching circuit of FIG. 8 or a corresponding circuit.

Further, the control circuit 186 switches the switching circuit 185 to apply the voltage output from the voltage generation circuit 184 to a low-pass filter 170 while inactivating a charge pump 160. That is, in a charge pump 160 having the same configuration as that of FIG. 8, an enable signal is not applied to any of the charge pump units CP so that every one of the charge pump units CP are inactivated.

This series of processes end the initialization of the clock signal generator 100. The generation of the recording clock signal subsequent to the initialization will now be described for when the optical disc 1 is a DVD-R/RW and when the optical disc 1 is a DVD+R/RW.

[Example in which the optical disc 1 is a DVD-R/RW]

When the clock signal generator 100 receives the wobble signal, the first loop L1 synchronizes the frequencies of the clock signal oscillated by the voltage-controlled oscillator 110 (actually, the divisional clock signal divided by the divider 105) and the wobble signal. In this state, the second loop L2 inactivates the charge pump 160, and the DC current voltage of the voltage generation circuit 184, or constant voltage, is applied to the control voltage input terminal Tb of the voltage-controlled oscillator 110. At this point in time, the second loop L2 is controlled as an open loop and invalidated.

In the first loop L1, when the first monitor circuit 180 detects that the difference between the frequencies of the divisional clock signal of the clock signal oscillated by the voltage-controlled oscillator 110 and the wobble signal is included within a predetermined range, the control circuit 186 switches the second loop L2 to a closed loop. That is, the switching circuit 185 is switched so that a predetermined number of charge pump units CP in the charge pump 160 are driven and so that the voltage of the voltage generation circuit 184 is not applied to the low-pass filter 170. This applies voltage to the control voltage input terminal Tb of the voltage-controlled oscillator 110 in correspondence with the difference between the phases of the clock signal oscillated by the voltage-controlled oscillator 110 (actually, the divisional clock signal generated by the divider 176) and the LPP signal.

In addition to the switching, the control circuit 186 performs control to lower the drive capacity of the charge pumps 130a and 130b. This lowers the significance of the first loop L1 in comparison with that of the second loop L2 after the difference between the frequencies of the wobble signal and the recording clock signal decreases. That is, after the synchronization of the wobble signal and the recording clock signal is substantially completed, the recording clock signal is subtly affected by the first loop L1. Thus, the control enables fine adjustment of the recording clock signal with the second loop L2.

Further, when rough adjustment is being performed by the first loop L1, the voltage of the voltage generation circuit 184 is applied to the control voltage input terminal Tb of the voltage-controlled oscillator 110 to smooth switching by fine adjustment with the second loop L2. This prevents the oscillation frequency from suddenly changing due to a sudden fluctuation in the value of the voltage applied to the control voltage input terminal Tb when switching the charge pump 160 from an inactivated state to an activated state.

It is preferred that the voltage applied to the control voltage input terminal Tb based on the voltage generation circuit 184 be set to be about the same as the voltage assumed to be applied to the control voltage input terminal Tb by the second loop L2 when the phases of the clock signal oscillated by the voltage-controlled oscillator 110 and the LPP signal are synchronized. This minimizes fluctuation of the value of the voltage applied to the control voltage input terminal Tb of the voltage-controlled oscillator 110 when the charge pump 160 is switched from an inactive state to an active state.

Further, it is preferred that the voltage applied to the control voltage input terminal Tb based on the voltage generation circuit 184 be a substantially median value between the maximum and minimum values of the voltage applied to the control voltage input terminal Tb.

[Example in Which the Optical Disc 1 is a DVD+R/RW]

When the clock signal generator 100 receives the wobble signal, the first loop L1 synchronizes the frequencies of the clock signal oscillated by the voltage-controlled oscillator 110 (actually, the divisional clock signal divided by the divider 105) and the wobble signal. In the second loop L2, the charge pump 160 is inactive and the DC voltage of the voltage generation circuit 184, or constant voltage, is applied as the control voltage to the control voltage input terminal Tb of the voltage-controlled oscillator 110. When the optical disc 1 is a DVD+R/RW, the second loop L2 is controlled as an open loop.

When the optical disc 1 is a DVD+R/RW, the gain of the first loop L1 differs from when the optical disc 1 is a DVD-R/RW. That is, due to the difference in the frequencies of the wobble signals, appropriate controlling with different gains is enabled. For example, since the wobble signal of the DVD-R/RW is lower than the frequency of the wobble signal of the DVD+R/RW, it is preferred that the gain, until the frequency difference of the first loop L1 is included in the predetermined range for the DVD-R/RW, be greater than that of the DVD+R/RW.

The gain adjustment is performed by adjusting the gain (drive capacity) of the voltage-controlled oscillator 110 or the charge pumps 130a and 130b.

Further, the voltage generation circuit 184 may generate different voltages. This enables appropriate controlling in accordance with whether the optical disc 1 is a DVD-R/RW or a DVD+R/RW.

The preferred embodiment has the advantages described below.

(1) When the optical disc 1 is a OVD-R/RW, the recording clock signal is generated with the first loop L1 and the second loop L2. When the optical disc 1 is a DVD+R/RW, the recording clock signal is generated with the first loop L1. This generates an operation clock signal that is in accordance with the type of the optical disc 1.

(2) When the optical disc 1 is a DVD+R/RW, constant voltage is applied to the control voltage input terminal Tb of the voltage-controlled oscillator 110. Thus, the clock signal generator used when the optical disc 1 is a DVD-R/RW is also used to appropriately generate a clock signal when the optical disc 1 is a DVD+R/RW. In addition, by adjusting the voltage applied to the control voltage input terminal Tb of the voltage-controlled oscillator 110, the control parameter for generating the clock signal when the optical disc 1 is a DVD+R/RW is increased. This increases freedom for generating the clock signal.

(3) The drive capacity of the voltage-controlled oscillator 110 and the drive capacity of the charge pump 130a differs when the optical disc 1 is a DVD-R/RW and when the optical disc 1 is a DVD+R/RW. Thus, when there is a difference between the frequencies of the wobble signals, feedback control is properly performed when the clock signal is generated.

(4) The dividing ratios of the divider 105 and the divider 176 differ when the optical disc 1 is a DVD-R/RW and when the optical disc 1 is a DVD+R/RW. More specifically, the dividing ratios of the divider 105 and the divider 176 when the optical disc 1 is a DVD-R/RW is smaller than when the optical disc 1 is a DVD+R/RW. This generates the recording clock signal properly from each wobble signal.

(5) The first loop. L1 and the second loop L2 share the voltage-controlled oscillator 110. This reduces the circuit scale of the clock signal generator 100.

(6) The voltage-controlled oscillator 110 incorporates the first current source 112 and the second current source 114. This enables the characteristics of the voltage-controlled oscillator 110 to be variable.

(7) The gains of the charge pumps 130a and 130b in the first loop L1 are variable. The gain is decreased when switching from rough adjustment to fine adjustment. This enables the second loop L2 to perform fine adjustment in an optimal manner.

(8) The command circuit 172 predicts the period during which the LPP signal is detected and enables the phase comparator 150 to perform processing only during the predicted period. This prevents noise from being erroneously recognized as the LPP signal.

(9) The rising edges and the falling edges of the pulses of the divisional clock signal, which is generated from the clock signal oscillated by the voltage-controlled oscillator 110, and the wobble signal are compared to control the voltage-controlled oscillator 110 while eliminating the influence of changes in the duty ratio of the reproduced wobble signal.

It should be apparent to those skilled in the art that the present invention may be embodied in many other specific forms without departing from the spirit or scope of the invention. Particularly, it should be understood that the present invention may be embodied in the following forms.

The signal input to the first loop L1 does not have to be a wobble signal and may be a divisional signal of the wobble signal.

The signal input to the second loop L2 is not limited to the LPP signal and may be a divisional signal of the LPP signal.

The configuration of the voltage-controlled oscillator 110 is not limited to that shown in FIG. 2. For example, the current control devices that control the amount of power supplied to each inverter IV of the ring oscillator 118 does not have to be configured by an n-channel transistor and a p-channel transistor.

The gain of the voltage-controlled oscillator 110 is used to initialize the register 115a. However, the gain may be variable when the clock signal generator is operating. Such a configuration is especially effective when the clock signal generator is applied to a data recording device in which the angular velocity is constant.

The configurations of the rising edge comparator 120a, the falling edge comparator 120b, the phase comparator 150, and the charge pumps 130a, 130b, and 160 are not limited to the configurations shown in FIGS. 8, 9, and 11.

The comparison of the wobble signal and the clock signal, which is oscillated by the voltage-controlled oscillator 110, in the first loop that generates the clock signal, which is the frequency synchronized with the wobble signal, does not have to be performed with both the rising edges and the falling edges. For example, only the rising edge may be used to generate a signal that is substantially synchronized with the wobble signal.

The process for generating the window pulse in the command circuit 172 of FIG. 1 may be eliminated, for example, when noise is erroneously detected as the LPP signal.

The present invention is not limited to a configuration in which a first loop L1 and a second loop L2 share a voltage-controlled oscillator. In other words, the first loop L1 and the second loop L1 may each incorporate a different voltage-controlled oscillator. In such a case, the voltage applied to the control voltage input terminal of the second loop K2 is switched in the same manner as in the preferred embodiment to minimize fluctuation of the oscillation frequency of the voltage-controlled oscillator when the second loop L2 is switched from opened loop control to closed loop control.

The dividing ratios of the dividers 105 and 176 are not limited to those ratios of the preferred embodiment For example, even if there is a demand for 186 pulses in each cycle of a wobble for the clock signal that actually controls data recording, the dividing ratio may be set to 372. Such setting enables various demands to be met appropriately during the recording of data.

The configuration of the data recording controller is not limited to that shown in FIG. 1.

The present examples and embodiments are to be considered as illustrative and not restrictive, and the invention is not to be limited to the details given herein, but may be modified within the scope and equivalence of the appended claims.

What is claimed is:

1. A PLL circuit for receiving either one of first and second reference signals to generate a clock signal synchronized with one of the first and second reference signals, wherein the first reference signal is generated by superimposing a first wobble signal having a first cycle on a land pre-pit signal, and the second reference signal is generated from a second wobble signal having a second cycle shorter than the first cycle, the PLL circuit comprising:
    a voltage-controlled oscillator for generating the clock signal in accordance with control voltages;
    a first loop, connected to the voltage-controlled oscillator, for controlling at least one of a frequency and a phase of the clock signal in accordance with one of the first wobble signal and the second wobble signal;
    a second loop, connected to the voltage-controlled oscillator, for controlling at least one of the frequency and the phase of the clock signal in accordance with the land pre-pit signal, wherein the first and second loops are validated when the PLL circuit is provided with the first reference signal, and the first loop is validated and the second loop is invalidated when the PLL circuit is provided with the second reference signal.

2. The PLL circuit according to claim 1, wherein the second loop supplies the voltage-controlled oscillator with control voltage in accordance with a phase difference between the first reference signal and the clock signal when the PLL circuit is provided with the first reference signal, and the second loop supplies the voltage-controlled oscillator with constant control voltage when the PLL circuit is provided with the second reference signal.

3. The PLL circuit according to claim 2, further comprising:
    a voltage generation circuit for generating the constant voltage; and
    a switching circuit, connected between the voltage generation circuit and the second loop, for connecting the voltage generation circuit to the second loop when the PLL circuit is provided with the second reference signal and for disconnecting the voltage generation circuit from the second loop when the PLL circuit is provided with the first reference signal.

4. The PLL circuit according to claim 1, wherein the first loop includes:
    a phase comparator for outputting a phase difference signal that is in accordance with one of a phase difference between the first wobble signal and the clock signal and a phase difference between the second wobble signal and the clock signal; and
    a charge pump for generating a controlled output current in accordance with the phase difference signal, the charge pump having a variable gain.

5. The PLL circuit according to claim 4, wherein the charge pump includes:
    a plurality of charge pump units; and
    a gain switching circuit for selectively driving the charge pump units in accordance with the phase difference signal, the gain switching circuit changing the number of the charge pump units that are driven to vary the gain of the charge pump.

6. The PLL circuit according to claim 1, further comprising:
    a divider for dividing at least one of the first wobble signal, the second wobble signal, and the clock signal, the divider having a dividing ratio that differs when the PLL circuit is provided with the first reference signal and when the PLL circuit is provided with the second reference signal.

7. The PLL circuit according to claim 1, wherein the voltage-controlled oscillator variably alters the rate of change of at least one of the frequency and the phase of the clock signal relative to the control voltages.

8. The PLL circuit according to claim 1, wherein the voltage-controlled oscillator includes:
    a first input terminal connected to the first loop and supplied with control voltage from the first loop in accordance with one of the phase difference between the first wobble signal and the clock signal and the phase difference between the second wobble signal and the clock signal;
    a second input terminal connected to the second loop and supplied with control voltage from the second loop in accordance with the phase difference between the land pre-pit signal and the clock signal; and
    a ring oscillator for generating an oscillation output signal in accordance with the control voltages applied to the first and second input terminals.

9. A PLL circuit for generating a clock signal from a first wobble signal having a first cycle and a land pre-pit signal or from a second wobble signal having a second cycle shorter than the first cycle, the PLL circuit comprising:
    a voltage-controlled oscillator including a first input terminal and a second input terminal respectively receiving a first control voltage and a second control voltage for generating the clock signal with a frequency and a phase that are in accordance with the first and second control voltages;
    a first loop, connected to the voltage-controlled oscillator, including a first divider for dividing the clock signal to generate a first divisional clock signal and a frequency comparator, connected to the first divider, for comparing the frequency of one of the first wobble signal and the second wobble signal with the frequency of the first divisional clock signal, the first loop generating the first control voltage in accordance with the frequency difference between the two compared signals;
    a second loop, connected to the voltage-controlled oscillator, including a second divider for dividing the clock signal to generate a second divisional clock signal and a phase comparator, connected to the second divider, for comparing the phase of the land pre-pit signal and the phase of the second divisional clock signal, the second loop generating the second control voltage in accordance with the phase difference between the two compared signals, and the voltage-controlled oscillator being shared by the first and second loops; and a voltage generation circuit for generating a constant voltage;

wherein the first and second input terminals are respectively supplied with the first and second control voltages when the PLL circuit is provided with the first wobble signal and the land pre-pit signal, and the first and second input terminals are respectively supplied with the first control voltage and the constant voltage and the second control voltage is invalidated when the PLL circuit is provided with the second wobble signal.

10. The PLL circuit according to claim 9, wherein the first divider divides the clock signal with a first dividing ratio when the PLL circuit is provided with the first wobble signal, and the second divider divides the clock signal with a second dividing ratio, which differs from the first dividing ratio, when the PLL circuit is provided with the second wobble signal.

11. The PLL circuit according to claim 9, further comprising:

a switching circuit, connected between the voltage generation circuit and the second loop, for connecting the voltage generation circuit to the second loop when the PLL circuit is provided with the second wobble signal and for disconnecting the voltage generation circuit from the second loop when the PLL circuit is provided with the first wobble signal and the land pre-pit signal.

* * * * *